United States Patent
Hashimoto et al.

[11] Patent Number: 5,906,309
[45] Date of Patent: May 25, 1999

[54] SOLDER BUMP MEASURING METHOD AND APPARATUS

[75] Inventors: Yutaka Hashimoto, Atsugi; Hideaki Sasaki, Hadano; Mamoru Kobayashi, Hadano; Shinichi Kazui, Hadano, all of Japan

[73] Assignee: Hitachi, Ltd., Tokyo, Japan

[21] Appl. No.: 08/759,949

[22] Filed: Dec. 3, 1996

[30] Foreign Application Priority Data

Dec. 5, 1995 [JP] Japan .................................. 7-316283

[51] Int. Cl.⁶ .............................. B23K 3/08; G01B 11/24
[52] U.S. Cl. ........................ 228/9; 250/559.23; 356/376
[58] Field of Search .................................. 228/8, 9, 102, 228/104, 105; 356/376; 250/559.23, 559.34

[56] References Cited

U.S. PATENT DOCUMENTS

| | | | |
|---|---|---|---|
| 4,891,529 | 1/1990 | Braun et al. | 250/560 |
| 4,997,274 | 3/1991 | Takakusagi et al. | 356/376 |
| 5,206,705 | 4/1993 | Tokura | 356/376 |
| 5,298,977 | 3/1994 | Shintani et al. | 356/376 |
| 5,401,979 | 3/1995 | Kooijman et al. | 356/376 |
| 5,521,707 | 5/1996 | Castore et al. | 356/376 |
| 5,621,814 | 4/1997 | Honda | 356/376 |

FOREIGN PATENT DOCUMENTS 2-80905   3/1990   Japan .

*Primary Examiner*—Samuel M. Heinrich
*Attorney, Agent, or Firm*—Fay, Sharpe, Beall, Fagan, Minnich & McKee

[57] ABSTRACT

A work having a number of solder bumps on a substrate is mounted on a work positioning mechanism, and scanned by an optical micro head to measure errors of a mount posture of the work. Each stage is controlled to correct the errors, and thereafter, the apex positions of the bumps are scanned and measured. The measurement results are collected by a personal computer, and the measurement results together with control data of each axis are sent to a main personal computer and displayed on its screen. An error of an apex position of each bump from a regression plane is calculated, and if the error is smaller than a reference value, the work is judged to be good.

10 Claims, 9 Drawing Sheets

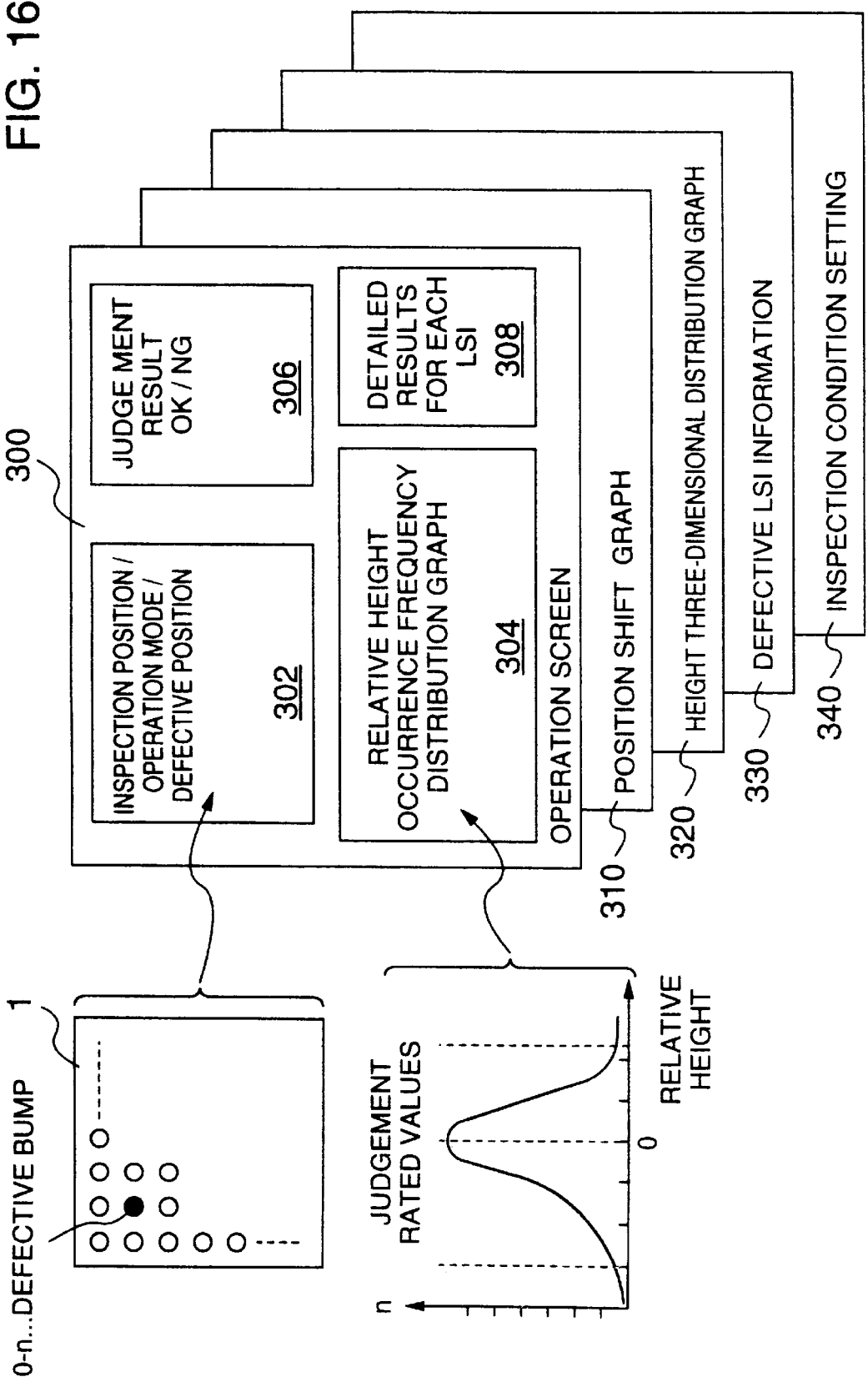

SOLDER BUMP MEASURING METHOD AND APPARATUS

BACKGROUND OF THE INVENTION

1. Field of the Invention

The present invention relates to a method and apparatus for measuring solder bumps formed on a semiconductor module such as LSI, on TAB (Tape Automated Bonding), and the like.

2. Description of the Related Art

FIGS. 1A to 1C illustrate the structure of a semiconductor module 1 having a number of solder bumps. FIG. 1A is a diagram showing the overall structure of the semiconductor module. FIG. 1B is an enlarged view of a bump area A of the semiconductor module and illustrates a relative position of solder bumps. FIG. 1C is an enlarged view of a bump 10 (corresponding to B in FIG. 1A).

A number of solder bumps 10 are formed on the bottom of the semiconductor module 1. Each bump is used for connection to a wiring board on which the semiconductor module 1 is mounted. The semiconductor module 1 is of a square shape having a side length of, for example, 10 mm. Solder bumps 10 are formed on the surface 8 at a pitch of, for example, 450 $\mu$m, totalling in number to 23×23.

Each bump 10 is generally spherical as shown in the enlarged view of FIG. 1C.

There is no apparatus for automatically measuring a height of a number of spherical bumps to date. Therefore, height is measured visually by using a focus-of-depth microscope or the like.

Works (to be measured) such as semiconductor modules formed with a number of bumps are positioned at a later process on a wiring board, and bumps are heated and melted in a heating furnace to be connected to the wiring board.

In order to reliably connect the bumps, it is necessary to correctly measure a height of each bump at its apex.

The size of each bump is required to have predetermined values so that adjacent bumps and wiring connections are prevented from being electrically shorted.

However, it is very difficult to measure heights of a number of bumps correctly and in a short time.

One of the inventors of this invention has proposed techniques of measuring a height of a work by using an optical beam, as disclosed in JP-A-2-80905.

SUMMARY OF THE INVENTION

It is an object of the present invention to provide a method and apparatus capable of measuring bumps on a work correctly at high speed.

The measuring method of this invention comprises the steps of: mounting a work to be measured on a table, the work having solder bump rows; detecting a reference bump from the solder bumps by using a laser optical micro head; scanning the solder bump rows with the optical micro head and detecting a shift amount of a mount posture of the work; correcting the shift amount of the mount posture of the work by scanning the table; and measuring height positions of apexes of all the solder bumps with the optical micro head.

The method of the invention further comprises the steps of calculating a regression plane formed by the apexes of the solder bumps and calculating a relative apex position of each solder bump relative to the calculated regression plane. The method of the invention further comprises the steps of calculating a standard deviation of relative heights and judging from the standard deviation and the apex height of each bump whether the work is defective or not.

A measuring apparatus of this invention comprises: a table for placing thereon a work to be measured, the work having solder bump rows; moving means for moving the table in a two-dimensional plane in two perpendicular axis directions; rotating means for rotating the table about a vertical axis; inclining means for inclining the table; a laser optical micro head mounted on the table to be movable in the vertical axis direction; a personal computer for recording data measured by the optical micro head in the form of digital data; controlling means for controlling the table and the optical micro head; a personal computer for calculating a height position of an apex of each solder bump in accordance with the data measured by the optical micro head; a display screen for displaying the calculated results; and a printer for printing out the calculated results.

According to the present invention, a work is measured by scanning a light spot by the optical micro head. Therefore, the drive speed can be changed depending upon a necessary measurement precision and the size of the work, so that high speed, high precision, and versatility can be realized for various applications.

As above, the invention provides a method and apparatus for measuring heights of all of a number of bumps formed on a work such as an LSI and judging whether the work is good or not. The invention is applicable to works having highly dense bumps expected in the future.

BRIEF DESCRIPTION OF THE DRAWINGS

FIG. 16 is a diagram illustrating a display screen of a monitor.

DETAILED DESCRIPTION OF THE PREFERRED EMBODIMENTS

Figure 1A:
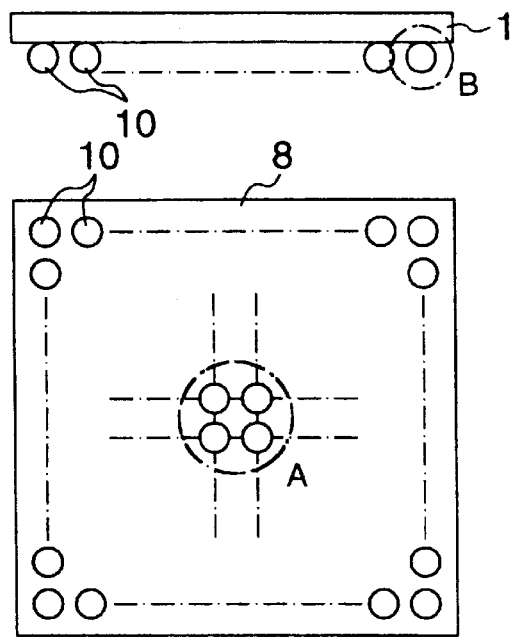
FIG. 1A illustrates a semiconductor module used as a work to be measured.
Figure 1B:
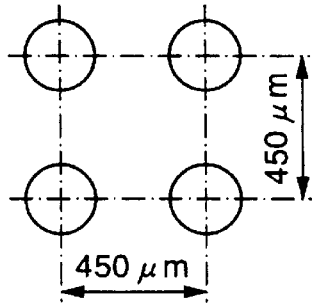
FIGS. 1B and 1C are enlarged views showing bumps and a bump on the semiconductor module.
Figure 1C:
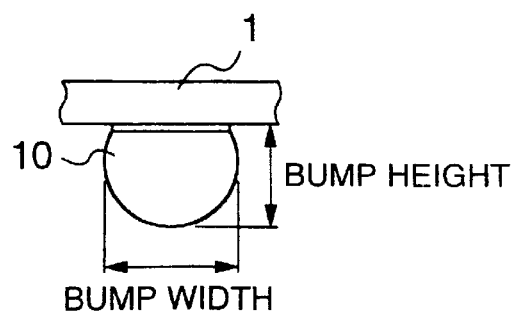
Figure 2:
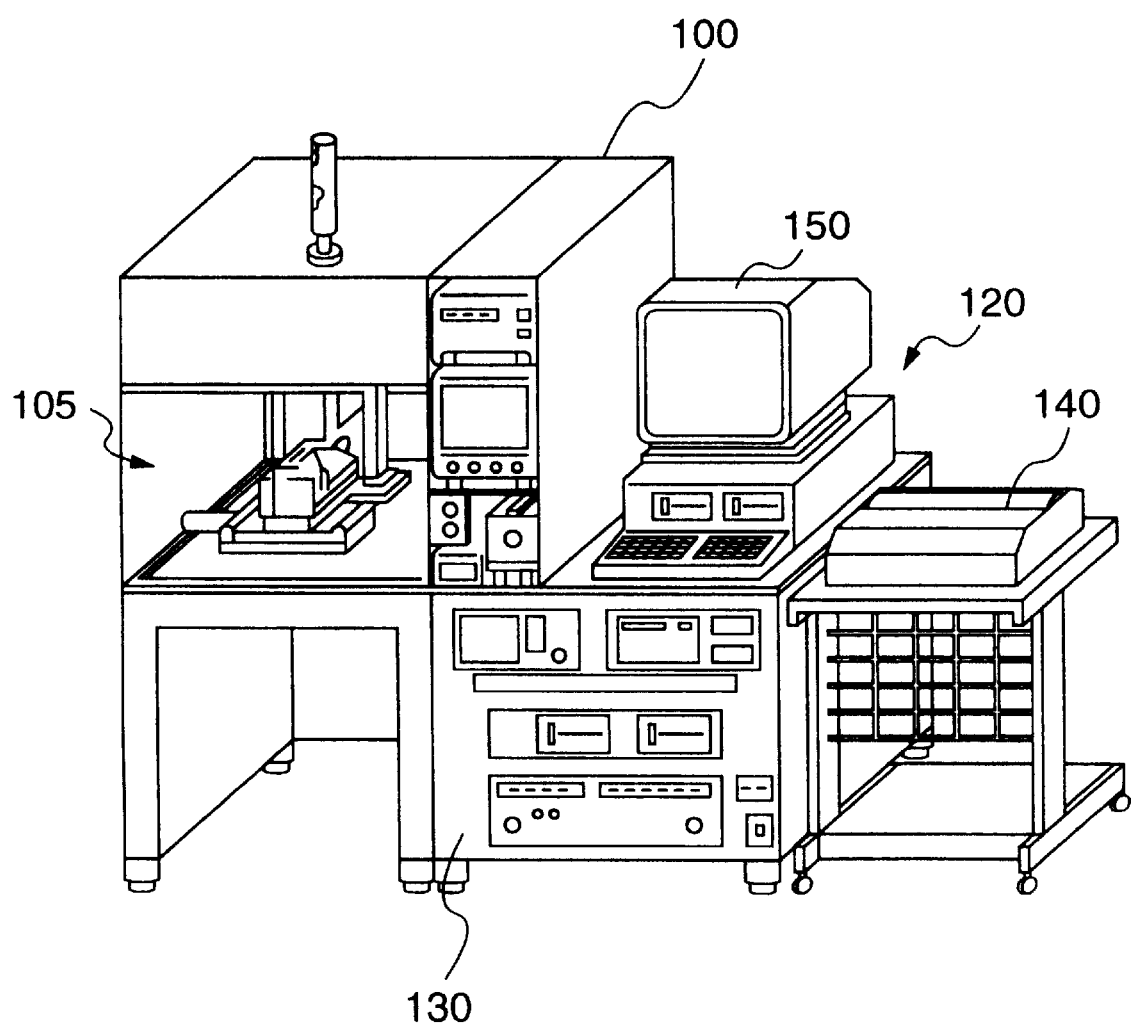
FIG. 2 is a perspective view of a measuring apparatus of this invention.

FIG. 2 is a diagram showing an apparatus used with a solder bump measuring method of this invention.

This measuring apparatus generally indicated by reference numeral 100 has an operation stage 105 on which a work is placed and measured, a control unit 120, an operation panel 130, a printer 140 for outputting measurement results, a monitor TV for monitoring a measurement area of the operation stage 105, and the like.

Figure 3:
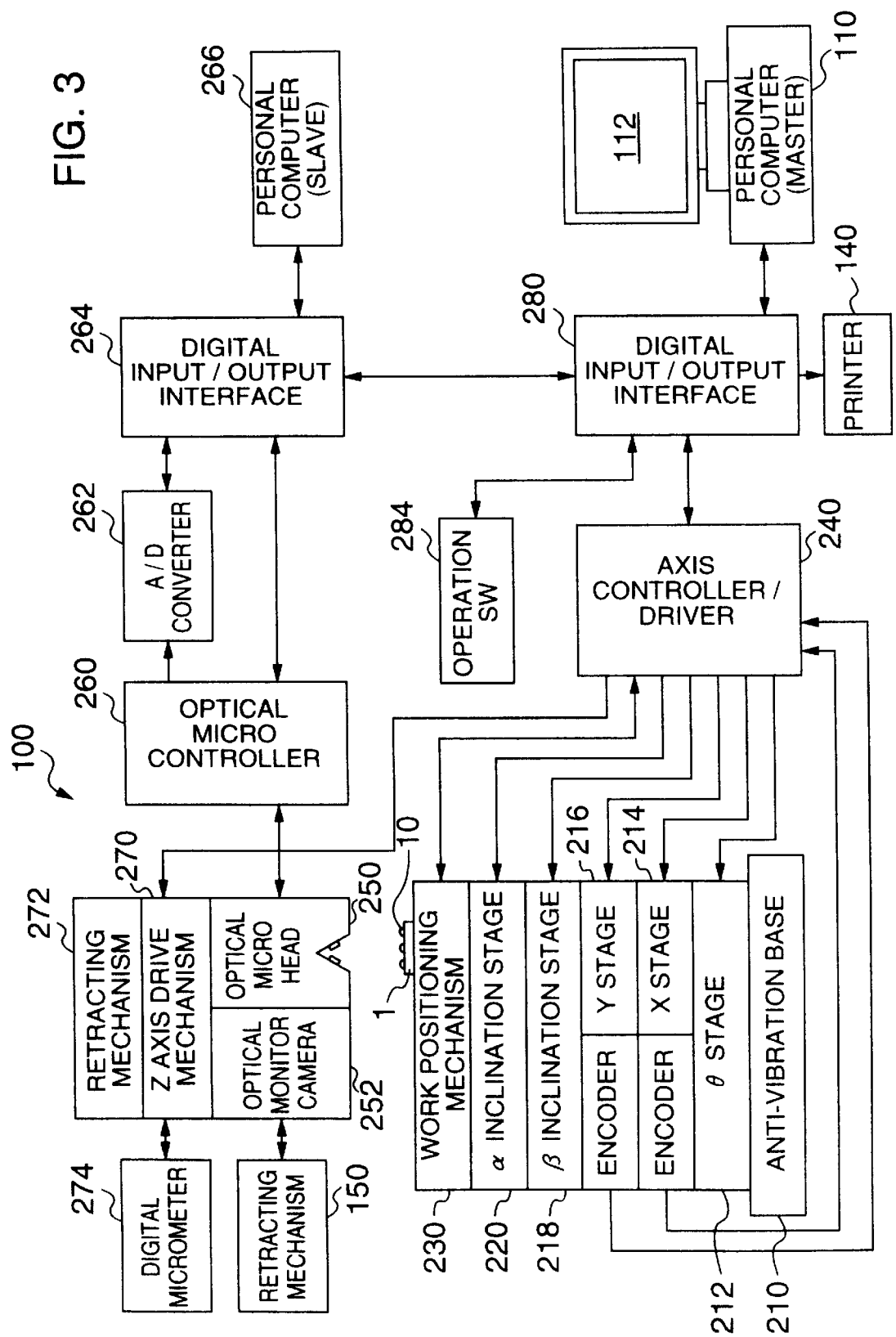
FIG. 3 is a block diagram showing the structure of the measuring apparatus of the invention.

FIG. 3 is a block diagram showing the control system of the measuring apparatus 100 shown in FIG. 2. A table frame on which a work 1 is placed is mounted on an anti-vibration base 210. The table frame has a θ stage 212 for controlling an angle around the work vertical axis (Z axis), an X stage 214 for controlling a motion in a guide axis (X axis) in the plane perpendicular to the vertical axis, a Y stage 214 for controlling a motion in a guide axis (Y axis) perpendicular to the X axis, and a β inclination stage 218 and an α inclination stage 220 respectively for controlling inclination of the surface of a work positioning mechanism (work table) 230.

Each control axis is controlled by outputs from an axis controller/driver apparatus 240.

An optical microsensor 250 is mounted on a Z axis driver mechanism 270 and is used for controlling the optical microsensor in the Z axis relative to the work table 230. This optical microsensor 250 can be retracted away from a measuring position of the work table 230 by a retracting mechanism 272 so that the work 1 can be easily placed on or dismounted from the operation stage. A motion amount in the Z axis is measured by a digital micrometer 274.

An optical camera 252 is mounted at the side of the optical microsensor 250, and the state of the measuring area can be monitored by a CRT 150.

The optical microsensor 250 is controlled by a controller 260, and the measured data is A/D converted and supplied via a digital input/output interface 264 to a computing apparatus, for example, a personal computer 266.

The measurement results are supplied via a digital input/output interface 280 to a computing apparatus, for example, a master personal computer 110. The measurement results are displayed on the personal computer 110 and printed out from a printer 140.

The measurement results of solder bumps are judged in accordance with coordinate data of each bump position and correction amount data of each control axis, by using an operation switch 284.

Figure 4:
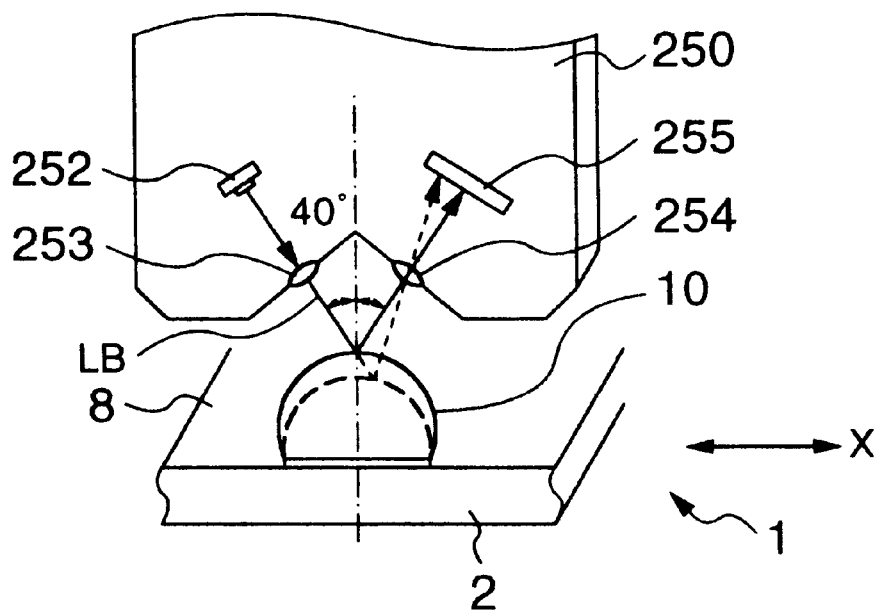
FIG. 4 is a perspective view showing the structure of an optical micro head.

FIG. 4 shows the structure of the optical micro head 250 which has a semiconductor laser 252 and a light receiving element 255. A laser beam radiated from the semiconductor laser 252 passes through a lens 253 and applied to a bump 10 as a laser beam LB. The laser beam reflected at the surface of the bump 10 passes through a lens 254 and is received by the light receiving element 255. The light receiving element 255 measures the height position of the bump surface in accordance with a position where the reflected light is received, by using the principle of triangulation, and also detects the amount of reflected light.

The X axis of the table is aligned with the optical axis of the laser beam LB.

Figure 5:
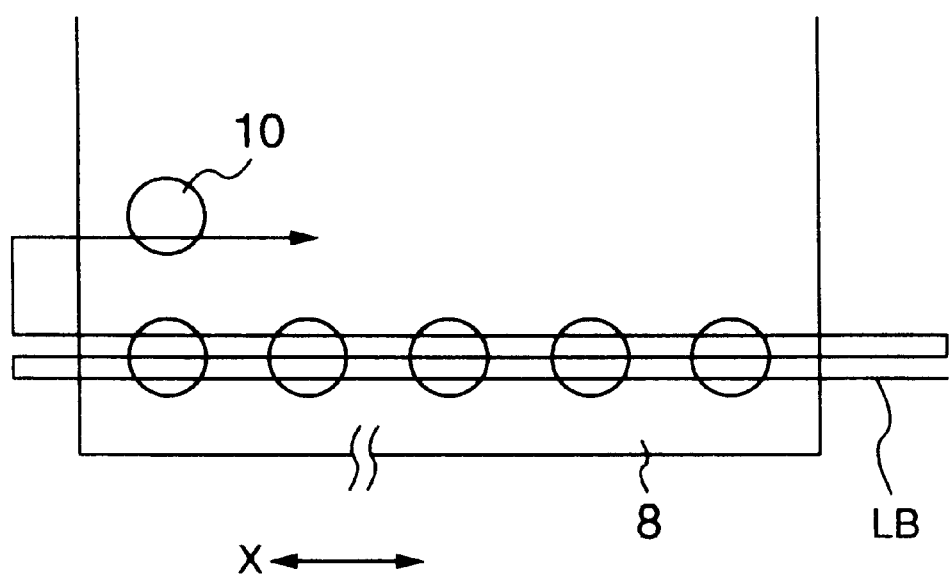
FIG. 5 is a plan view illustrating scanning of an optical micro head.

FIG. 5 shows scan paths along which the bump 10 is scanned with the laser beam LB. The surface area including the apex of the bump 10 is measured by three paths. Three paths are used for obtaining a correct value while considering the position displacement of each bump. Three paths are only illustrative and a plurality of paths may be set depending upon the measurement conditions.

Figure 6:
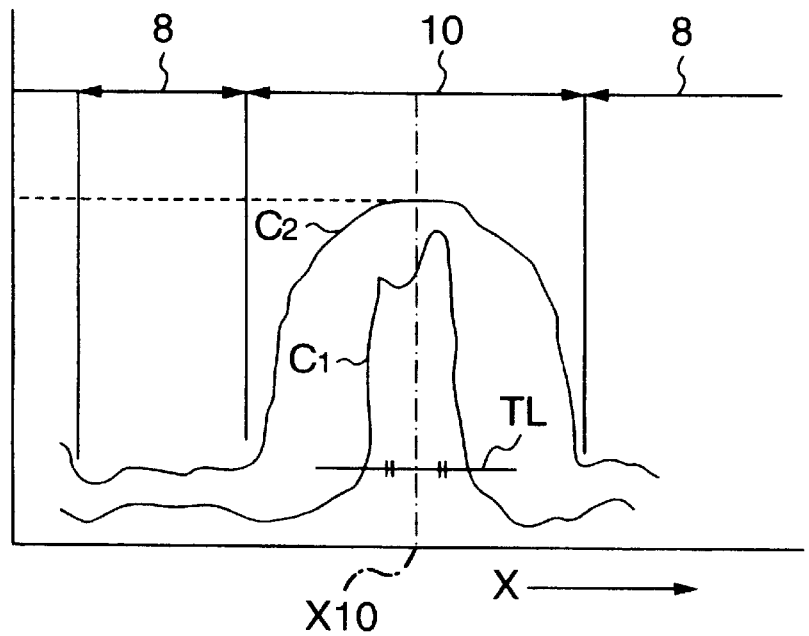
FIG. 6 is a diagram showing an example of measurement results.

FIG. 6 shows an example of the measurement results wherein the abscissa represents the X axis and the ordinate represents a detected level. A first curve C1 indicates a level of reflected and received light, and a second curve C2 indicates a change in height of the bump.

A reference value TL of the level of the reflected and received light C1 is preset. An X axis position where the received light becomes larger than the reference value TL and an X axis position where the received light becomes smaller than the reference value are detected. The value of the height signal C2 at the middle coordinate position X10 is used as the height of the apex of the bump.

Figure 7A:
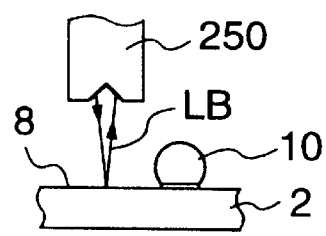
FIGS. 7A and 7B are diagrams illustrating a method of measuring the apex of a solder bump on a substrate surface.
Figure 7B:
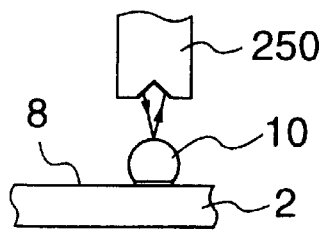

FIGS. 7A and 7B illustrate a relationship between the surface 8 of the substrate 2 and the height position of the bump 10.

The laser beam LB scans the surface 8 of the substrate 2 and the bump 10 to detect the height positions of the surface 8 and bump 10.

Figure 8:
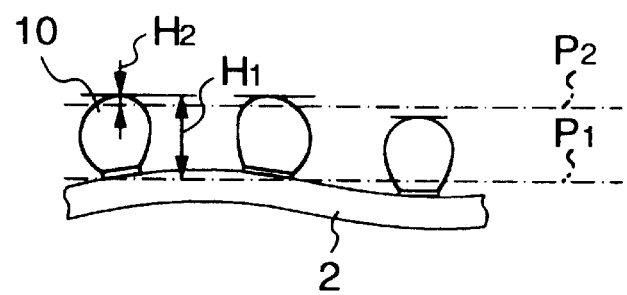
FIG. 8 is a diagram illustrating the effects of swell of a substrate.

The substrate is not always absolutely flat, since it may have a swell or the like. Therefore, as shown in FIG. 8, a regression plane P1 of the surface 8 of the substrate 8 and a regression plane P2 of the apexes of bumps are calculated.

An absolute height H1 from the regression plane P1 and a relative height H2 from the regression plane P2 are then obtained.

There is not always a constant relationship between the size and shape of the substrate of a work to be measured and the position of each solder bump on the substrate, because a work precision of the substrate has a limit. Therefore, after the work is placed on the table, the mount posture of the work is aligned before measurement.

The regression plane means a virtual plane which minimizes the distances to bumps. This is the same concept as a regression line. It is more effective from the viewpoint of process to evaluate the bump height from the distance to the regression plane than using the absolute bump height.

Figure 9:
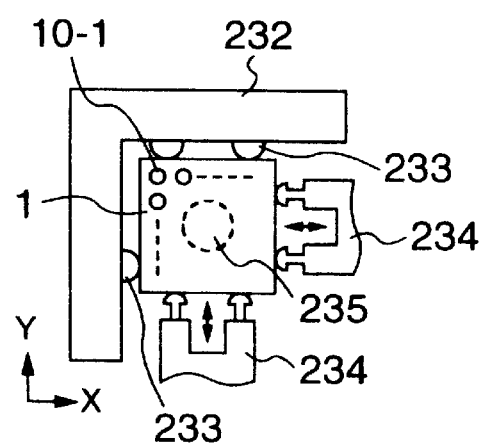
FIG. 9 is a plan view illustrating a mount of a work on a work table.

FIG. 9 shows a positioning device for positioning an LSI carrier as a work on the work table 230 which moves in X and Y directions.

A work 1 is of a square shape. A right angle block 232 conformal to the work 1 is mounted on the table 230. The block 232 has reference stoppers 233. The work 1 is pushed against the stoppers 233 by a pushing pin 234 which moves toward the stoppers 233.

The table 230 has a suction device 235 which uses a negative pressure to suck the bottom of the work 1.

There are some errors of the outer dimension of the LSI substrate and bump positions because of substrate scribe errors, shrinkage of substrate material, or the like.

Figure 10:
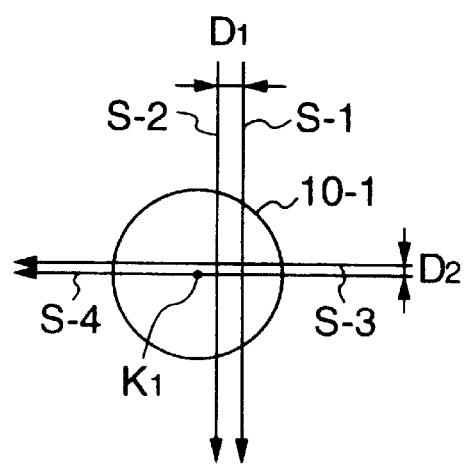
FIG. 10 is a plan view illustrating a method of detecting a bump apex position.

For this reason, a process of detecting the position of a first bump 10-1 of the work 1 is executed as illustrated in FIG. 10.

The controller knows in advance the position, as designed, of the first bump 10-1 relative to the substrate of the work 1. Therefore, first, the coordinates of the X axis of the table are aligned with the design coordinates of the first bump 10-1, and a first scan S-1 is performed for measurement while moving the table in the Y direction.

With this scan S-1, a curve indicating a change in the amount of reflected and received light of the first bump 10-1, such as the curve C1 shown in FIG. 6, can be obtained. The center position of the light amount of this curve is obtained, this position being assumed as the center (origin) of the first bump 10-1. If the received light amount does not exceed the reference value, the X axis coordinates are shifted by a distance D1 to execute a second scan S-2 to detect the temporary origin and determine the Y axis coordinates.

Next, after the Y axis coordinates are fixed, a scan S-3 is performed in the X axis direction to determine the position of the first bump 10-1 from the center of the received light amount. If the received light amount does not exceed the reference value at the X axis coordinates, the Y axis coordinates are shifted by a distance D2 to execute a scan S-4 to perform similar operations as above.

The coordinate values obtained in the above manner are used as a temporary origin K1.

Figure 11:
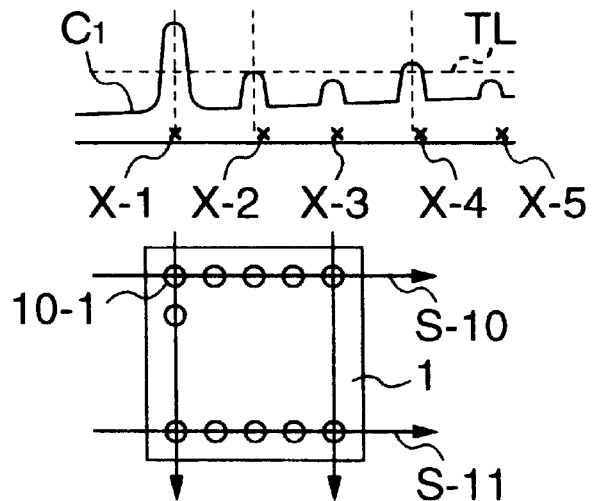
FIG. 11 is a diagram illustrating measurement results with substrate mount errors.

A first row of bumps including the temporary origin K1 is scanned (S-10), and the apex positions of bumps are obtained which show a received light amount in excess of the reference value. An average value of shift amounts between the X axis coordinates of apex positions and the designed X axis coordinates is calculated (refer to FIG. 11).

Next, a similar scan (S-11) is performed for the bump row remotest from the above bump row to thereby calculate an average value of shift amounts in the X axis coordinates.

In accordance with shift amounts, a correction value of a distance from the end of the work substrate to the first bump in the X axis direction is determined to correct the X axis coordinates of the origin.

Similar scans are executed in the Y axis direction to calculate the shift amounts of the Y axis coordinates and correct the Y axis coordinates of the origin.

Figure 12A:
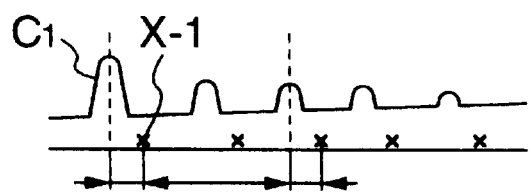
FIG. 12A is a diagram illustrating measurement results with substrate mount errors.

If the work is mounted being rotated about the center axis and a scan is performed by shifting the scan position by a designed value, then the peak values of the received light amount on the scan line change in a predetermined direction and a shift occurs between the peak position and the design position (refer to FIG. 12A).

Figure 12B:
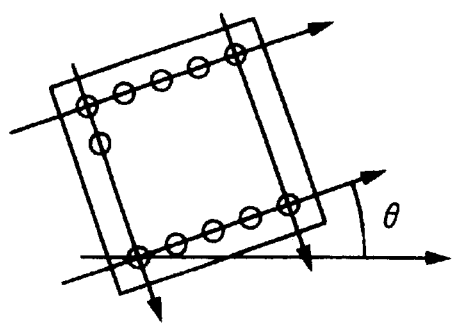
FIG. 12B is a diagram illustrating rotation correction of mount errors.

In accordance with this change, a correction value for the work rotation angle θ is calculated to rotate the θ stage and correct its position (refer to FIG. 12B).

Figure 13:
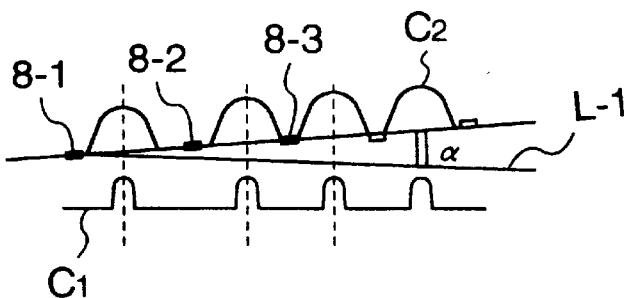
FIG. 13 is a diagram illustrating measurement results with substrate mount errors.

While a scan for the θ correction is executed in the X axis direction, the heights at positions 8-1, 8-2, 8-3, . . . on the work substrate are also detected (refer to FIG. 13). In accordance with the change in the heights, a regression line L-1 is calculated and a correction value α for an inclination angle from the reference line (horizontal line) in the X axis direction is calculated to correct the α inclination stage 220.

Similarly, a correction value β for an inclination angle in the Y axis direction is calculated to correct the β inclination stage 218.

After the above alignment processes are completed, all bumps are scanned to measure the apex heights as already described with FIG. 5.

With precise alignment, a measuring laser beam can be scanned highly precisely at high speed. Therefore, the bump heights can be measured highly precisely at high speed.

Figure 14:
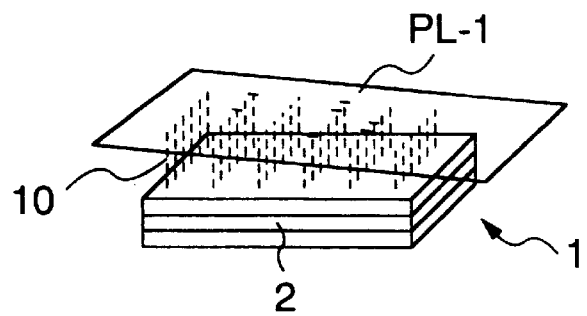
FIG. 14 is a diagram illustrating a regression plane of apexes of solder bumps.

FIG. 14 shows a regression plane PL-1 formed by the measured apex positions of bumps 10. A shift of each bump apex position is calculated from this regression plane PL-1 and the judgement results are displayed on the display 112.

Figure 15:
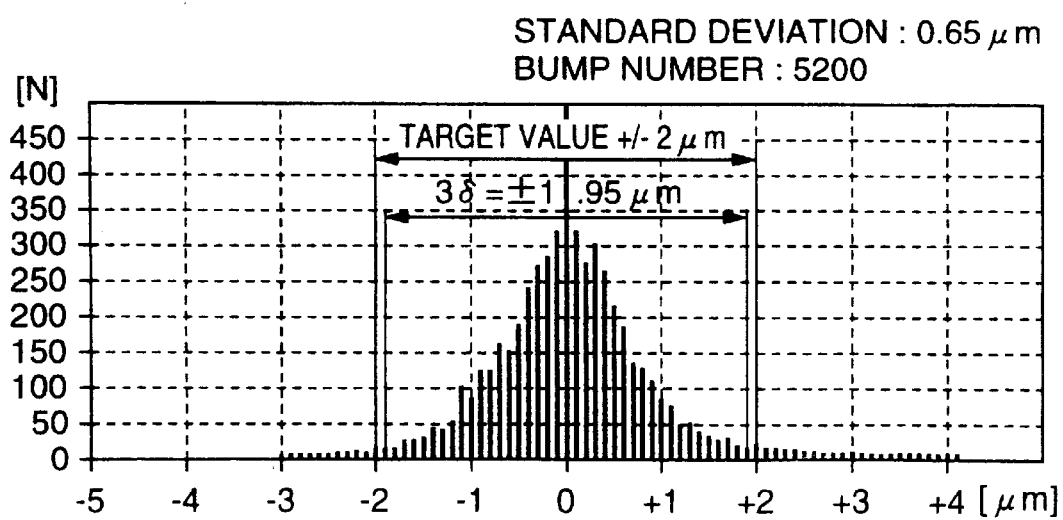
FIG. 15 is a graph showing a standard deviation of measurement results.

FIG. 15 is a graph showing the measurement results displayed on the screen.

The abscissa represents a difference between each bump apex and the regression plane, and the ordinate represents the number of bumps.

This work has 5200 bumps, the standard deviation is 0.5 μm, and 3 δ is ±1.95 μm.

If a target value is set to ±2 μm, the work is judged good from the standard deviation, and is transported to the next process. The work may be judged good to transport it to the next process, if all bumps are in a range of predetermined reference values.

FIG. 16 shows examples of various displays displayed on the screen 112 of the measuring apparatus.

An operation screen 300 has a display area 302 for a present operation mode and the like, an area 304 for displaying a relative height occurrence frequency distribution graph, an area 306 for displaying judgement results, and an area 308 for displaying the detailed results for each LSI as a work.

In the area 302, the following items are displayed.

(a) Present operation mode (alignment, apex measurement, base measurement, judgement calculation, second time individual measurement).

(b) Present inspection position (row, column) with graphics and values.

(c) Coordinates of defective bump of inspected LSI with graphics and values.

For the display of the position of a defective bump, for example, the position of a defective bump 10-N of the work 1 is displayed with graphics.

The relative height occurrence frequency distribution graph 304 is shown in FIG. 15. The judgement results are displayed in the area 306 by OK or NG. For the detailed results for each LSI in the area 308, the alignment results are displayed by values of X, Y, Z, θ, α, and β, and also a bump average height, standard deviation of relative heights, received light average amount, and base shrinkage ratios in X and Y directions are displayed.

A position shift graph screen 310 shows a distribution of a shift amount of an apex position from a design value for each bump.

A height three-dimensional distribution graph screen 320 shows a 3D graph of relative heights of respective bumps and a two-dimensional distribution graph in different colors.

A defective LSI information graph screen 330 shows a judgement mode of a defective LSI after full automatic operation (in units of magazine).

An inspection condition setting screen 340 is used for setting inspection parameters such as judgement threshold values.

With this invention, for example, an operation speed of 32 mm/sec, optical micro head frequency of 16 kHz, measurement resolution in the horizontal direction of 2 to 3 μm, and measurement resolution in the height direction (Z direction) of 0.05 μm, can be realized.

What is claimed is:

1. An apparatus for measuring solder bumps formed on a substrate mounting thereon a semiconductor element, comprising:

a table for placing thereon a work to be measured, the work having a plurality of solder bumps;

moving means for moving said table in a two-dimensional plane in two perpendicular axial directions;

rotating means for rotating said table about a vertical axis;

inclining means for inclining said table;

a measuring mechanism mounted on said table and movable in the vertical axis direction for measuring heights of said solder bumps by using a laser;

recording means for recording data in the form of digital data measured by said measuring mechanism;

controlling means for controlling operations of said table and said measuring mechanism;

computing means for calculating a height of an apex of each solder bump and judging success or failure of said solder bumps in accordance with the data recorded by said recording means; and a display means for displaying a display screen comprising a first area showing success or failure of said solder bumps and a second area showing positions of said solder bumps judged as a failure.

2. A solder bump measuring apparatus according to claim 1, wherein said display screen includes a third area showing detailed measured results of said solder bumps and a fourth area showing a standard deviation of heights of said solder bumps.

3. A solder bump measuring apparatus according to claim 1, wherein said display means displays a second display screen displaying a graph showing a distribution of shift amounts between design values and measured values of apex positions of the solder bumps.

4. A solder bump measuring apparatus according to claim 1, wherein said display means displays a third display screen displaying a three-dimensional graph showing relative heights of the solder bumps.

5. A solder bump measuring apparatus according to claim 1, wherein said display means displays a fourth display screen displaying the data of a work judged as defective.

6. A solder bump measuring apparatus according to claim 1, wherein said display means displays a fourth display screen displaying a screen for setting a parameter used for the judgment of the work whether the work is good or bad.

7. An apparatus for measuring solder bumps formed on a substrate mounting thereon a semiconductor element, comprising:

a table for placing thereon a work to be measured, the work having a plurality of solder bumps;

moving means for moving said table in a two-dimensional plane in two perpendicular axial directions;

rotating means for rotating said table about a vertical axis;

inclining means for inclining said table;

a measuring mechanism mounted on said table and movable in the vertical axis direction for measuring heights of said solder bumps by using a laser;

a retracting mechanism retracting said measuring mechanism from a position for measuring the work, when the work is mounted on or removed from said table;

recording means for recording data in the form of digital data measured by said measuring mechanism;

controlling means for controlling operations of said table and said measuring mechanism;

computing means for calculating a height of an apex of each solder bump and judging success or failure of said solder bumps in accordance with the data recorded by said recording means; and display means for displaying results judged by said computing means.

8. An apparatus for measuring solder bumps formed on a substrate mounting thereon a semiconductor element, comprising:

a table for placing thereon a work to be measured, the work having a plurality of solder bumps;

moving means for moving said table in a two-dimensional plane in two perpendicular axial directions;

rotating means for rotating said table about a vertical axis;

inclining means for inclining said table;

a positioning mechanism positioning the work in a predetermined position on said table, when the work is mounted on said table;

a measuring mechanism mounted on said table and movable in the vertical axis direction for measuring heights of said solder bumps by using a laser;

recording means for recording data measured by said measuring mechanism in the form of digital data;

controlling means for controlling operations of said table and said measuring mechanism;

computing means for calculating a height of an apex of each solder bump and judging success or failure of said solder bumps in accordance with the data recorded by said recording means; and display means for displaying results judged by said computing means.

9. A solder bump measuring apparatus according to claim 8, wherein said positioning mechanism comprises a position block mounted on said table and a setting mechanism setting the work by pushing the work to the positioning block.

10. A solder bump measuring apparatus according to claim 8, wherein said table includes a holding mechanism holding the work by suction.

* * * * *